United States Patent
Hsu et al.

(10) Patent No.: US 6,274,466 B1
(45) Date of Patent: Aug. 14, 2001

(54) METHOD OF FABRICATING A SEMICONDUCTOR DEVICE

(75) Inventors: Chung-Po Hsu, Taipei Hsien; Ming-Chi Lin, Hsinchu, both of (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/328,967

(22) Filed: Jun. 9, 1999

(51) Int. Cl.⁷ .................................................. H01L 21/336
(52) U.S. Cl. .................................................... 438/519
(58) Field of Search ............................... 438/519, 309, 438/514, 527, 528–29

(56) References Cited

U.S. PATENT DOCUMENTS 5,185,276 * 2/1993 Chen et al. ........................ 438/309

FOREIGN PATENT DOCUMENTS

405070276 * 3/1993 (JP) ........................................ 117/223

OTHER PUBLICATIONS

Derwent ACC–No: 1993–137065. "Single crystal growing apparatus, for . . . indium arsinide, . . . " Derwent commercial abstract of Japanese publication JP–405070276–A also listed above.*

* cited by examiner

Primary Examiner—Tuan H. Nguyen
Assistant Examiner—Craig Thompson
(74) Attorney, Agent, or Firm—Jiawei Huang; J. C. Patents

(57) ABSTRACT

A method for fabricating a semiconductor device to increase the effective concentration of a doped region. A first dopant is implanted into a substrate. A second dopant is implanted into the substrate. The first dopant has a lower diffusion coefficient, a higher energy gap, and a higher atomic mass than those of the second dopant.

6 Claims, 1 Drawing Sheet

METHOD OF FABRICATING A SEMICONDUCTOR DEVICE

BACKGROUND OF THE INVENTION

1. Field of the Invention

The present invention relates to a fabrication method for integrated circuits. More particularly, the present invention relates to a method of fabricating a semiconductor device.

2. Description of the Related Art

Progress in semiconductor fabrication technologies has made it possible to fabricate semiconductor devices at the deep sub-micron level. As the sizes of devices decreases, it is necessary to control effectively a junction depth and a channel depth, in order to obtain a decreased threshold voltage and to prevent a short channel effect.

Of the many currently used P-type dopants, boron atoms (B) are most widely used. However, the boron atoms have a high diffusion coefficient. Thus, it is difficult to form a high-quality shallow junction by implanting the boron atoms. In order to control the junction depth and the channel depth, dopants having properties such as a high atomic mass, a low diffusion coefficient and a sufficient solubility in silicon are implanted. In the group-III elements, indium (In) atoms have a high atomic mass and a low diffusion coefficient, which is about 5 to 10 times lower than that of the boron atoms. Hence, implanting indium atoms as the P-type dopant has become popular.

However, indium atoms have a high energy gap, which is usually above 0.16 KeV. Additionally, the radius of an indium atom is larger than the radius of a silicon atom. Therefore, the indium atoms easily gather to form clusters due to the tendency to reduce the stress between the indium atoms and silicon substrate. If the indium atoms form clusters, the indium atoms cannot effectively serve as acceptors. Thus, the effective concentration of the implanted indium atoms cannot be increased as the implantation dosage increases during ion implantation. Actually, the effective concentration of the implanted indium atoms gradually approaches a concentration saturation point. The foregoing effect is called a freeze-out effect, which can be observed after performing ion implantation and annealing. Reference is made to FIG. 1, which shows the freeze-out effect observed by a graph showing the relationship between a dosage and a sheet conductance illustrated after performing ion implantation and annealing. The horizontal axis represents dosage, measured in $1/cm^2$. The vertical axis is sheet conductance, measured as a square unit/K ohm.

SUMMARY OF THE INVENTION

The invention provides a method of fabricating a semiconductor device. A first dopant and a second dopant are in-situ implanted in a substrate. The first dopant has a higher energy gap, a higher atomic mass, and a lower diffusion coefficient than those of the second dopant.

The invention also provides a method of fabricating a doped region of a semiconductor device. A first dopant and a second dopant are in-situ implanted into a substrate. A thermal step is performed to form a doped region comprising the first dopant and the second dopant in the substrate. The first dopant has a diffusion coefficient that is low enough to remain substantially in the doped region, and the energy gap and the atomic mass of the first dopant are higher than the energy gap and the atomic mass of the second dopant. In a case where the first dopant is indium atoms, the second dopant is preferably boron atoms. The dosage of the first dopant is 10 to 1000 times higher than the dosage of the second dopant.

Since the first dopant has a high atomic mass and a low diffusion coefficient, the junction depth and the channel depth of devices can be effectively controlled while the first dopant is implanted. Since the second dopant has a low atomic mass, the second dopant serves as a buffer to reduce the stress between the first dopant and the substrate. Thus, the first dopant does not gather to form clusters, and the freeze-out effect does not occur.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
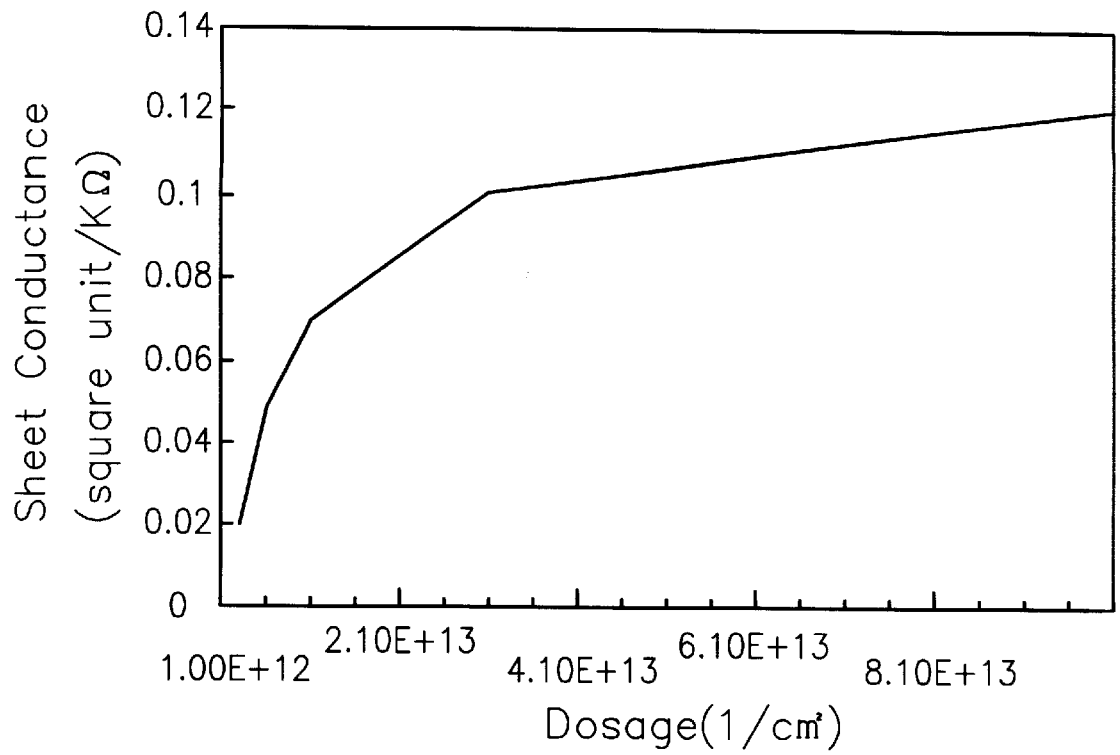
FIG. 1 is a graph showing the sheet conductance as a function of an increasing dosage.

Reference will now be made in detail to the present preferred embodiments of the invention, examples of which are illustrated in the accompanying drawings. Wherever possible, the same reference numbers are used in the drawings and the description to refer to the same or like parts.

Figure 2:
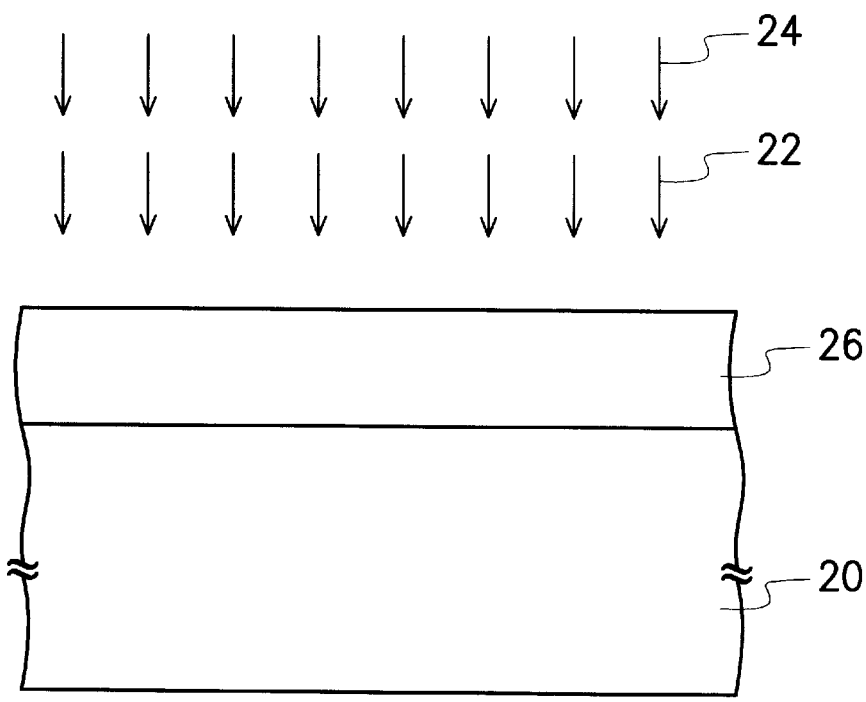
FIG. 2 is a schematic, cross-sectional view showing a semiconductor device according to one preferred embodiment of the invention.

In FIG. 2, at least two dopants comprising a first dopant 22 and a second dopant 24 are in-situ implanted in a substrate 20. A thermal step is performed. A doped region 26 is formed in a portion of the substrate 20. The first dopant 22 has a higher energy gap, a higher atomic mass, and a lower diffusion coefficient than the second dopant 24. Preferably, the dosage of the first dopant 22 is about 10 times to 1000 times higher than the dosage of the second dopant 24. Both the energy gap and the atomic mass of the first dopant 22 are higher than those of the second dopant 24. A thermal step is performed to form the doped region 26. Since the first dopant 22 has a high atomic mass and a low diffusion coefficient, the junction and the channel depth can be effectively controlled during a subsequent thermal process. Specifically, the implanted dopants substantially remain in the doped region 26 after the thermal step. In addition, since the second dopant 24 has a low energy gap, the second dopant 24 serves as a stepping stone between the valence band of the first dopant 22 and the valence band of the substrate 20. Thus, the dopants can effectively serve as acceptors or donors. In addition, because the second dopant 24 has atoms having a low atomic mass, the second dopant 24 can serve as a buffer for reducing the stress between the high-mass atoms, such as the first dopant 22, and the substrate 20. Thus, the formation of clusters gathered by atoms having a high atomic mass, such as the first dopant 22, does not occur.

The order of steps for implanting the first dopant 22 and the second dopant 24 is flexible. For example, the first dopant 22 can be implanted before the second dopant 24 is implanted. Alternatively, the first dopant 22 can be implanted after the second dopant 24 is implanted. However, it is necessary to implant the first dopant 22 and the second dopant before the thermal step.

The following description takes a P-type dopant for an example. The first dopant 22 is preferably indium atoms. Since indium atoms have a high atomic mass, which is about 114, and a low diffusion coefficient, the junction depth and the channel depth of devices can be effectively controlled while implanting the indium atoms. However, because indium atoms have a high energy gap, which is about 0.16 KeV, and a high atomic mass, the freeze-out effect easily occurs. The preferred embodiment prevents the occurrence of the freeze-out effect by implanting the second dopant 24, which is preferably boron atoms. Because the boron atoms have a low energy gap, which is about 0.044 KeV, the boron atoms can serve as a stepping stone between the valence band of indium atoms and the valence band of the substrate 20. Thus, the P-type dopant can effectively serve as an acceptor. Moreover, since the boron atoms have a low atomic mass, which is about 10, the boron atoms serve as a buffer to reduce the stress between the indium atoms and the substrate 20. Thus, the indium atoms do not gather to form clusters, so the freeze-out effect does not occur. The effective concentration is increased.

According to experimental results, the indium atoms having a dosage of about $1\times10^{14}$ atoms/cm$^2$ are implanted into the substrate 20 with an implanted energy of about 200 KeV. After a thermal step, sheet resistance is about 7510 ohms per square unit. If the boron atoms having a concentration of about $1\times10^{12}$ atoms/cm$^2$ are implanted into the substrate 20 before annealing, the sheet resistance is decreased to about 750 ohms per square unit. In comparison with a case where no boron ions are implanted, the resistance when the method of the invention is employed is about 10 times lower.

Accordingly, implanting dopants, such as the first dopant 22 and the second dopant 24 shown in this preferred embodiment, effectively controls junction depth and the channel depth and prevents the freeze-out effect. The effective concentration of the dopants is further increased, and thus the conductance is increased.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method for preventing a freeze-out effect of indium atoms, comprising:

in-situ implanting the indium atoms and a dopant in a substrate, wherein the dopant comprises atoms that have a lower energy gap and a lower atomic mass than those of the indium atoms.

2. The method of claim 1, wherein the dopant comprises boron atoms.

3. The method of claim 2, wherein a dosage of the indium atoms is about 10 times to 1000 times higher than a dosage of the boron atoms.

4. The method of claim 1, wherein the indium atoms and the dopant is implanted simultaneously.

5. The method of claims 1, wherein the indium atoms is implanted before the dopant is implanted.

6. The method of claim 1, wherein the indium atoms is implanted after the dopant is implanted.

* * * * *